(12) United States Patent
Murtojärvi

(10) Patent No.: US 6,392,501 B1
(45) Date of Patent: May 21, 2002

(54) METHOD AND ARRANGEMENT FOR TUNING A RESONATOR

(75) Inventor: Simo Murtojärvi, Salo (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/551,429

(22) Filed: Apr. 18, 2000

(30) Foreign Application Priority Data

Apr. 19, 1999 (FI) .................................................. 990873

(51) Int. Cl.⁷ .............................................. H03H 5/02
(52) U.S. Cl. ...................................... 333/17.1; 333/174
(58) Field of Search ................ 333/17.1, 174

(56) References Cited

U.S. PATENT DOCUMENTS

| | | | |
|---|---|---|---|
| 3,808,517 A | * | 4/1974 | Fletcher et al. ............. 323/106 |
| 4,361,894 A | * | 11/1982 | Kurihara et al. ............. 375/80 |
| 4,462,009 A | * | 7/1984 | Landt et al. ............. 333/17 R |
| 4,591,797 A | * | 5/1986 | Tanimoto et al. ............. 329/50 |
| 5,227,743 A | * | 7/1993 | Yamamoto ............. 333/17.1 |

FOREIGN PATENT DOCUMENTS

| | | |
|---|---|---|
| EP | 0034064 A3 | 8/1981 |
| EP | 0048661 A1 | 3/1982 |
| EP | 0868024 A1 | 9/1998 |

\* cited by examiner

*Primary Examiner*—Justin P. Bettendorf
*Assistant Examiner*—Joseph Chang
(74) *Attorney, Agent, or Firm*—Perman & Green, LLP

(57) ABSTRACT

The invention relates to a bandpass filter that follows the frequency of an input signal especially for reducing the noise on the receive band of mobile communications devices. More specifically the invention relates to a method and arrangement for tuning a resonator (100), where an input signal feeds the resonator in such a manner that the resonator oscillates at the frequency of the input signal, and where the center frequency of the pass band of the resonator is set substantially to the frequency of the input, signal. In accordance with the invention, there is generated (200) a difference signal ($V_c$, $V_e$) proportional to the phase difference ($\Delta\phi$) between the input signal voltage ($V_i$) and resonator voltage ($V_o$) and the resonance frequency of the resonator is changed using the difference signal in such a manner that said phase difference becomes smaller. Using the invention, the resonance frequency of the resonator can be set relatively accurately to the input signal frequency because the phase characteristic of the resonator is at its steepest at the resonance frequency, whereby the phase difference detector reacts strongly on even the slightest changes in frequency.

10 Claims, 3 Drawing Sheets

METHOD AND ARRANGEMENT FOR TUNING A RESONATOR

BACKGROUND OF THE INVENTION

1. Field of the Invention

The invention relates to a bandpass filter that follows the frequency of an input signal especially for reducing the noise on the receive band of mobile communications devices.

2. Description of the Related Art

In two-way radio apparatus part of the noise on the receive band is generated by the transmission circuitry in the apparatus. To reduce such noise in GSM mobile stations, for example, a transmitter specification specifies that the noise power density on the receive band shall not exceed −79 dBm/100 kHz. Taking into account the signal-to-noise ratio and maximum transmission power of commercial quadrature modulators, an additional attenuation of at least 12 dB is needed on the receive band in the transmission circuit.

From the prior art it is known to use a duplex filter to provide sufficient attenuation on the receive band. A disadvantage of the duplex filter is that it attenuates the transmitted signal, too. Therefore, the power of the output stage has to be increased correspondingly, which results in a considerable increase in the current consumption of the apparatus.

In addition, an arrangement is known in which the noise on the receive band is attenuated by a filter fixed in front of the output stage and by a notch filter. The stop band of the notch filter is situated at the bottom end of the transmit frequency band and it is switched on only when the upper channels are being used. Noise transmitted from the bottom end of the transmit band to the receive band because of the nonlinearity of the output stage is thus attenuated. The disadvantage of such an arrangement is its technical complexity and, consequently, relatively large extra costs.

Furthermore, an arrangement is known in which the modulation result at first falls within a relatively low constant frequency range. The noise-attenuating filtering can in that case be realized by means of one and the same low-pass filter independent of the RF channel. FIG. 1 shows such a structure according to the prior art. It comprises a modulator 11, phase difference detector 12, low-pass filter 13, which is the noise-attenuating filter mentioned above, and a voltage-controlled oscillator 14 that produces a radio-frequency signal RF OUT. A control signal n determines the RF channel. The RF signal from the oscillator 14 is multiplied in a mixer 16 with a signal from a synthesizer 15, the frequency of which depends on the channel selected, producing signal A which is always in the same frequency range. This is taken to the modulator 11 where it is quadratically modulated using baseband signals I and Q. The result is signal B the phase of which is compared with the phase of a constant-frequency sine wave. Said constant frequency $f_{ref}$ determines the frequencies of signals A and B. If the frequency or phase of signal B changes because of modulation, the output signal C from filter 13 controls the oscillator 14 in such a manner that a corresponding change occurs in the output signal RF OUT. The change is corresponding because of the feedback via mixer 16. A disadvantage of the method is that it is not suitable for modulations in which the carrier amplitude varies, too.

An object of the invention is to provide a solution for tuning a resonator, which solution makes it possible to reduce above-mentioned disadvantages associated with the prior art.

BRIEF SUMMARY OF THE INVENTION

The basic idea of the invention is as follows: An input signal, which may be e.g. a modulated carrier wave, feeds a resonator-type bandpass filter the resonance frequency of which is electrically adjustable. The resonance frequency is forced to follow the input signal frequency on the basis of the phase of the resonator voltage: If the frequency of the input signal, which equals the frequency of the resonator voltage, changes, the phase of the resonator voltage changes, too. A signal is generated which is proportional to the phase difference between the input signal voltage and resonator voltage. This signal is used to control the reactance of the resonator in such a manner that the resonance frequency changes in the same direction as the frequency of the input signal. As the resonance frequency reaches the new frequency of the input signal, said phase difference has decreased so that it is near zero and the resonance frequency stops changing. Thus the resonance frequency follows the frequency of the input signal.

An advantage of the invention is that the resonance frequency of the resonator can be set relatively accurately to the input signal frequency because the phase characteristic of the resonator is at its steepest at the resonance frequency whereby the phase difference detector reacts strongly on even the slightest frequency changes. As the resonance frequency can be set accurately, the filter comprised of the resonator can be adapted so as to attenuate noise relatively close to the input signal frequency. Thus e.g. the above-mentioned noise attenuation on the receive band of the GSM network can be realized without complicated additional arrangements. Another advantage of the invention is that the structure according to the invention allows for the use of modulations resulting in carrier wave amplitude changes. A further advantage of the invention is that the tuning to the new frequency is very quick. A yet further advantage of the invention is that the manufacturing costs of the structure according to the invention are relatively low.

The method according to the invention for tuning a resonator, in which method an input signal feeds a resonator in such a manner that the resonator oscillates at the frequency of the input signal and the center frequency of the pass band of the resonator is set substantially to the input signal frequency, is characterized in that in order to set the center frequency

- there is generated a difference signal proportional to the phase difference between the input signal voltage and resonator voltage, and
- the resonance frequency of the resonator is changed by means of the difference signal in such a manner that said phase difference becomes smaller.

The arrangement according to the invention for tuning a resonator is characterized in that the arrangement comprises

- means for generating a difference signal proportional to the phase difference of an input signal voltage and resonator voltage, and
- means for changing the resonance frequency of the resonator in such a manner that said phase difference becomes smaller.

Preferred embodiments of the invention are described in the dependent claims.

BRIEF DESCRIPTION OF THE SEVERAL VIEWS OF THE DRAWINGS

The invention is below described in detail. Reference is made to the accompanying drawings in which.

DETAILED DESCRIPTION OF THE INVENTION

Figure 1:
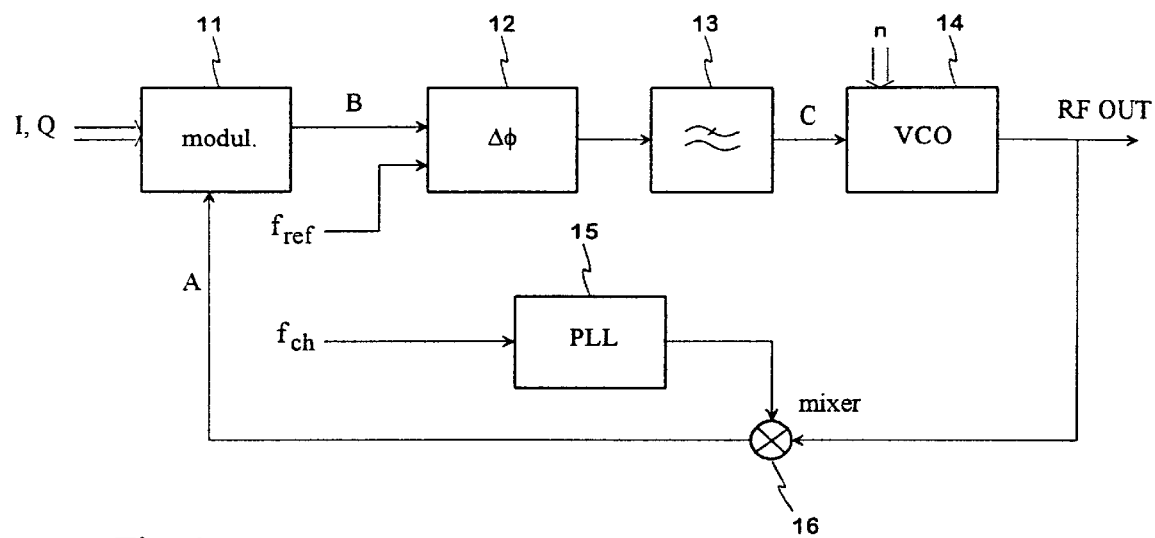
FIG. 1 shows a block diagram of a structure according to the prior art.

FIG. 1 was already discussed in connection with the description of the prior art.

Figure 2:
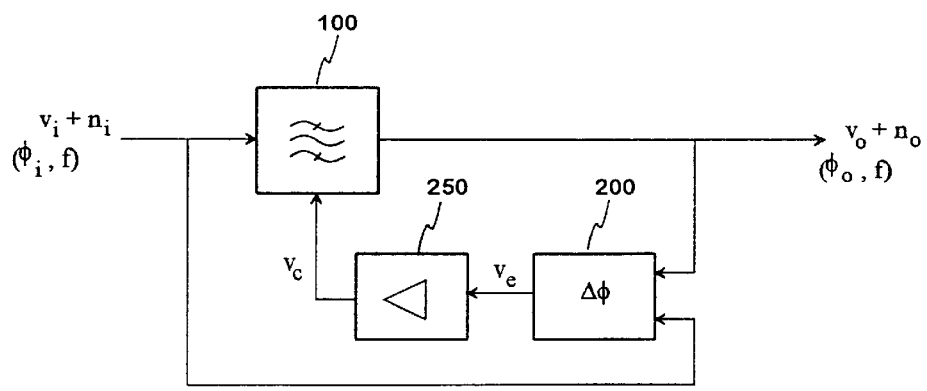
FIG. 2 shows a block diagram of a structure according to the invention.

FIG. 2 illustrates a solution according to the invention in the form of block diagram. It includes as functional blocks a bandpass filter 100, phase difference detector 200 and an amplifier 250. A signal $v_i$ with a frequency f and phase $\phi_i$ is brought to the filter. Signal $v_i$ may be frequency modulated, in which case f refers to its center frequency. The filter outputs a signal $v_o$ the frequency of which equals that of the input signal and the phase of which is $\phi_o$. Summed to the input signal $v_i$ is noise $n_i$ and to the output signal $v_o$ noise $n_o$. Because of the filter, the power density of the output signal noise $n_o$ at a given distance from frequency f is smaller than that of the input signal noise $n_i$. The input and output signals of the filter 100 are taken to the phase difference detector 200 which produces a signal $v_e$ proportional to the phase difference $\phi_o - \phi_i$. This signal is amplified in block 250. In the real circuit, the amplifier may be included in the phase difference detector. Signal $v_c$ produced by the amplifier 250 is brought to the filter 100 where it determines the location of the pass band of the filter according to the basic idea of the invention described above: Feedback forces the center frequency of the pass band to follow the signal frequency f.

Figure 3:
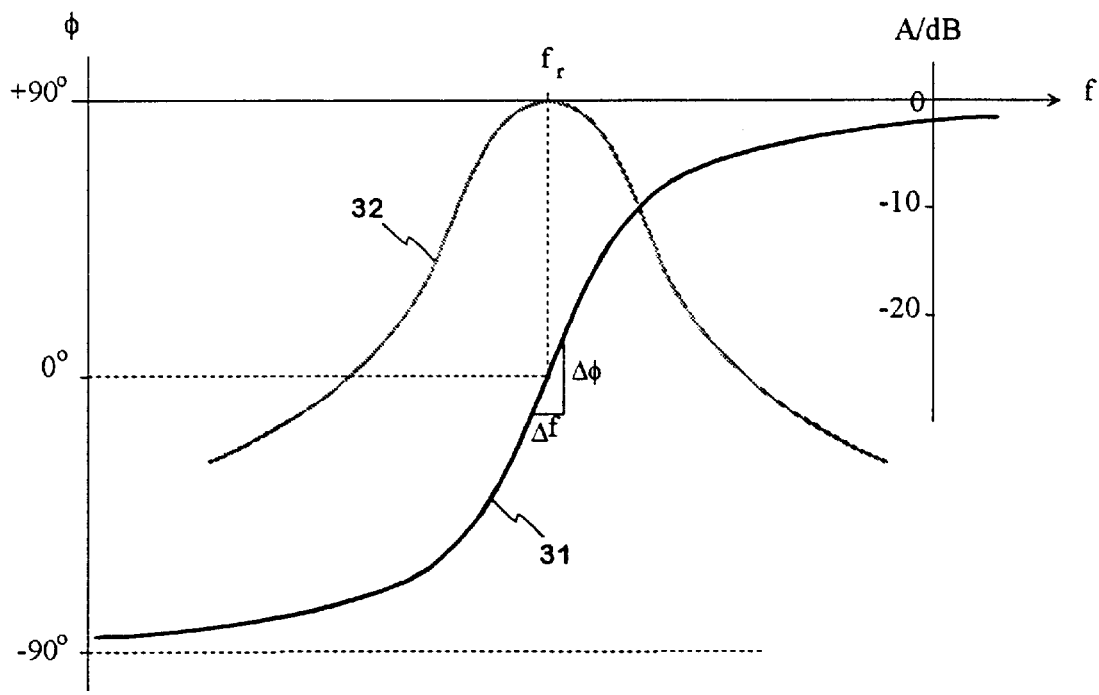
FIG. 3 shows by way of example the frequency response of a resonator filter.

FIG. 3 shows an example of the frequency response of a resonator-type bandpass filter. The frequency response comprises an amplitude response 32 and phase response 31. Amplitude A is at its greatest at resonance frequency $f_r$. Phase $\phi$, or the phase difference between the output and input signals, changes from −90° to +90° as the frequency increases from a very low to a very high value. At the resonance frequency $f_r$ the phase $\phi$ is zero. The invention makes use of the shape of the phase response. Around the resonance frequency $f_r$ the phase $\phi$ changes relatively steeply as the frequency f changes, in other words the slope $\Delta\phi/\Delta f$ of the phase response 31 is rather steep, i.e. the sensitivity coefficient $s_1$ is relatively great. Consequently, by following the phase change the resonance frequency $f_r$ can be set to the input signal frequency more accurately than by following e.g. the amplitude change.

Figure 4:
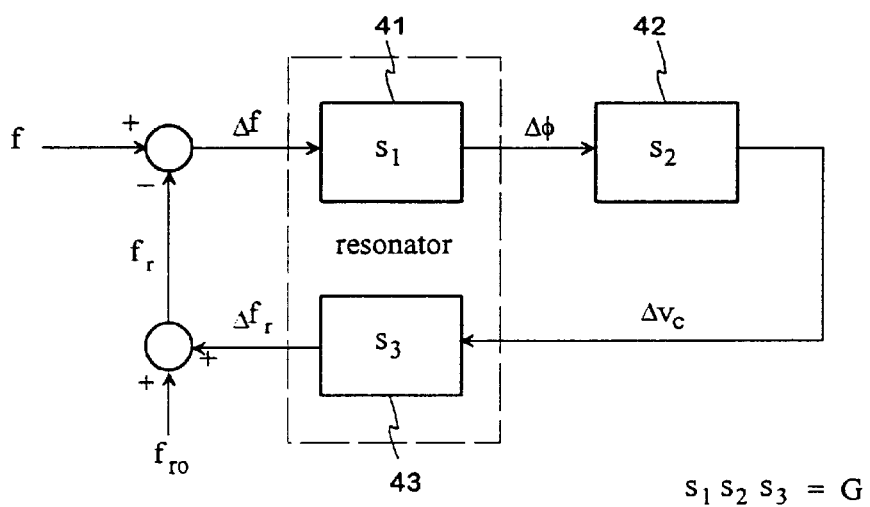
FIG. 4 shows a linear model of a structure according to the invention.

FIG. 4 shows a linear model of a system according to the invention, corresponding to FIGS. 2 and 3. The model includes three sensitivity coefficients $s_1$, $s_2$ and $s_3$. First, a difference $\Delta f$ of the input signal frequency f and resonance frequency $f_r$ is produced. Said difference is multiplied in block 41 by sensitivity coefficient $s_1$ of the resonance circuit, producing a phase difference $\Delta\phi$ corresponding to the frequency difference. In block 42 the phase difference $\Delta\phi$ is multiplied by sensitivity coefficient $s_2$. Coefficient $s_2$ equals the ratio $\Delta v_c/\Delta\phi$. So, it is indicative of how much the signal $v_c$ produced by the phase difference detector 200 and the associated amplifier 250 changes as the phase difference changes. In block 43 the change $\Delta v_c$ of signal $v_c$ is multiplied by sensitivity coefficient $s_3$. Coefficient $s_3$ equals the ratio $\Delta f_r/\Delta v_c$. So, it is indicative of how much the resonance frequency $f_r$ of the resonator 100 changes as the control signal $v_c$ changes. Change $\Delta f_r$ is added to a constant frequency $f_{ro}$ corresponding to the center frequency of the operating frequency range, producing an instantaneous value of the resonance frequency $f_r$. The product of the sensitivity coefficients $s_1$, $s_2$ and $s_3$ equals the total gain G of the loop formed by the structure, said G being a dimensionless number. FIG. 4 gives $$G(f-f_r)+f_{ro}=f_r, \text{ so } f_r=(Gf+f_{ro})/(G+1) \approx f-(f-f_{ro})/G \qquad (1)$$

The latter expression for the resonance frequency $f_r$ holds when the loop gain G is great. It can be seen that if the gain G is, say, one thousand, the resonance frequency $f_r$ is set at the input signal frequency f with an accuracy where the error is one per mille of the difference between frequency f and the center frequency $f_{ro}$ of the range.

Figure 5:
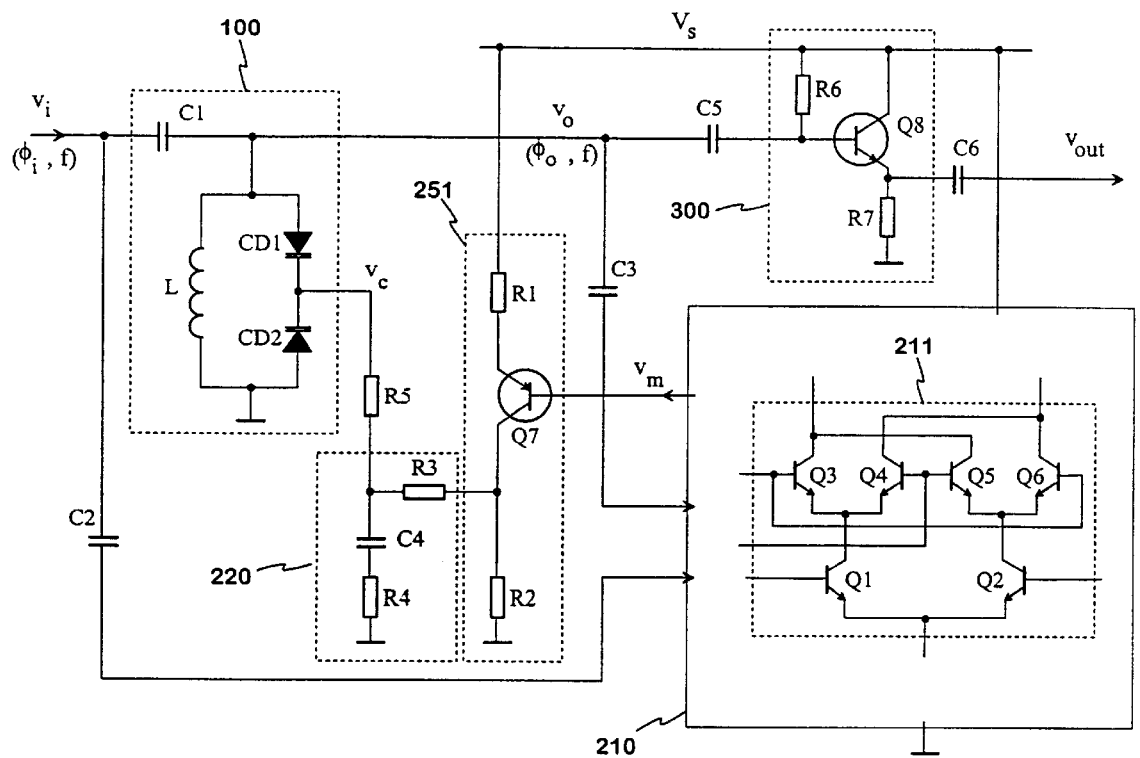
FIG. 5 shows an example of the structure according to the invention in the form of circuit diagram.

FIG. 5 shows an example of the circuit implementation of the invention, corresponding to FIG. 2. It includes a bandpass filter 100, analog multiplier 210, amplifier stage 251, low-pass filter 220 and a buffer amplifier 300. The input signal of the structure is $v_i$ the frequency of which is f and phase $\phi_i$. The output signal of the whole structure is $v_{out}$. The bandpass filter 100 comprises a parallel resonance circuit the inductive branch of which is formed by coil L and the capacitive branch of which is formed by capacitance diodes CD1, CD2 connected in series. In addition, the bandpass filter 100 comprises a capacitor C1 via which the input signal $v_i$ is fed to the resonator. The output signal of the filter 100 is $v_o$ the phase of which is $\phi_o$. The input signal $v_i$ is conducted via capacitor C2 and output signal $v_o$ via capacitor C3 to the analog multiplier 210 which gives their product $v_m$. The analog multiplier is based in this example on a widely known Gilbert cell 211 which has three differential pairs Q1-Q2, Q3-Q4 and Q5-Q6. One of the mutually multiplied signals controls pair Q1-Q2 and the other controls pairs Q3-Q4 and Q5-Q6. The output signal $v_m$ of the analog multiplier 210 is proportional to $$\sin\phi_e + \sin(4\pi f t) \qquad ,(2)$$

where t represents time. Phase $\phi_e$ refers to the deviation from 90° of the phase difference of the input voltages of the Gilbert cell. It equals the phase difference $\phi_o - \phi_i$. Signal $v_m$ is brought to the amplifier stage 251 which comprises a transistor Q7, resistor R1 connected from the emitter of said transistor to the supply voltage $v_s$, and resistor R2 connected from the collector to the ground. The voltage gain is in this case R2/R1. From the collector of transistor Q7 the signal is conducted to the low-pass filter 220. The filter comprises series-connected resistor R3 and capacitor C4 as well as resistor R4 one end of which is connected to the ground. The signal is taken out between resistor R3 and capacitor C4. When R4<<R3+R2 and time constant R4·C4>>1/(2πf), the filter attenuation at frequency 2f is (R3+R2)/R4, i.e. very high. At low frequencies no attenuation occurs, so the above-mentioned expression for signal $v_m$ is reduced down to the relatively slow-changing first term $\sin\phi_e$. When the phase difference $\phi_i - \phi_i$ is relatively small the output signal $v_c$ of the filter is proportional to it. Signal $v_c$ is conducted via resistor R5 between the resonator's capacitance diodes CD1, CD2. Signal $v_c$ determines the total capacitance of the diodes and thus the resonance frequency of the resonator. A suitable DC voltage level for the control voltage $v_c$ is obtained by suitable dimensioning of the amplifier stage 251. If, for example, the frequency f of signal $v_i$ increases, the resonator produces for the phase difference $\phi_o-\phi_i$ a positive non-zero value. The internal coupling of the analog multiplier 210 is such that the portion proportional to the phase difference in voltage $v_m$ then decreases. This results in the increase of the current of transistor Q7 and further in the increase of the control voltage $v_c$. The increase of the control voltage $v_c$ causes the capacitance of the resonator to drop and, hence, the resonance frequency to increase. The change comes to an end when the resonance frequency has reached the input signal frequency.

The output signal $v_o$ of the filter 100 is conducted via a decoupling capacitor C5 to the buffer amplifier 300, to the base of transistor Q8. Transistor Q8 is connected so as to function as an emitter-follower: The collector is connected directly and the base via resistor R6 to the supply voltage line, and the emitter via resistor R7 to the ground. The output signal $v_{out}$ of the whole structure is taken from the emitter of transistor Q8 via a decoupling capacitor C6.

It also follows from the feedback described above that the phase $\phi_o$ follows the phase $\phi_i$ of the input signal when changes occur in the latter while the frequency f stays constant. In this case the resonance frequency changes momentarily until the phase difference is reduced to zero. Independent of the phase difference follow-up, the filter 100 can be on the other hand easily dimensioned such that signal $v_o$ follows relatively low-frequency amplitude changes that possibly occur in the input signal $v_i$.

Figure 6:
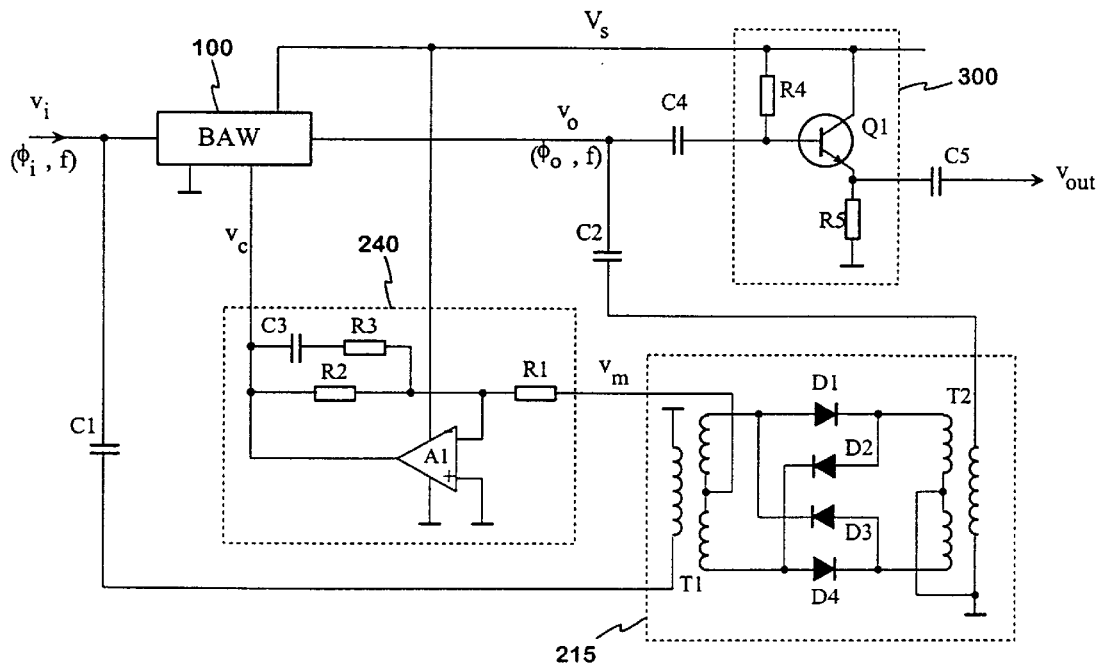
FIG. 6 shows another example of the structure according to the invention.

FIG. 6 shows another example of the circuit implementation of the invention. The filter 100 is a bulk acoustic wave (BAW) resonator. The filter's input and output signals are marked as in FIG. 5. They are in this example mixed using a well-known balanced diode mixer 215 which comprises matched diodes D1, D2, D3 and D4 as well as transformers T1 and T2. When the frequency components the frequencies of which are equal to or greater than the input signal frequency f are removed from the output signal $v_m$ of the mixer 215, a signal is left which is proportional to the phase difference $\phi_o-\phi_i$. Said high-frequency components are attenuated by an amplifier unit 240. It includes an operational amplifier A1 connected as an inverting amplifier. The input impedance of the operational amplifier is R1 and the feedback impedance comprises a parallel connection one branch of which comprises resistor R2 and the other branch of which comprises resistor R3 and capacitor C3 connected in series. The gain of unit 240 at relatively low frequencies is then R2/R1, and at relatively high frequencies (R2||R3)/R1, where R2||R3 represents the resistance of the parallel connection of resistors R2 and R3. In general the letter "R" in the drawing refers to both a resistor and its resistance. Similarly, "C" refers to both a capacitor and its capacitance. The desired filtering effect is achieved when R3<<R2. The output signal $v_c$ of unit 240 is brought to the BAW resonator 100 where it determines the resonance frequency of the resonator. The output signal $v_o$ of the filter 100 is brought to a similar buffer amplifier 300 as in FIG. 5 in order to produce the output signal $v_{out}$.

Above it was described solutions according to the invention, but the invention is not limited to the solutions described. For example, it is possible to use other known structures for the filter and the circuit that follows the phase difference. The invention can also be used in connection with systems that use different modulation and coding schemes, such as e.g. TDMA (Time Division Multiple Access), CDMA (Code Division Multiple Access) and UMTS (Universal Mobile Telecommunications System). The inventional idea can be applied in many different ways within the scope defined by the independent claims.

What is claimed is:

1. A method for reducing noise on a received band of a radio device, an input signal of which feeds a resonator so that the resonator oscillates at the frequency of the input signal, and in the method the center frequency of the pass band of the resonator is set substantially to the frequency of the input signal by generating a difference signal proportional to the phase difference between the input signal voltage and resonator voltage, by changing the resonance frequency of the resonator on the basis of the difference signal in such a manner that said phase difference becomes smaller, arranging said resonator to pass the input signal having modulation, and amplifying said difference signal to make the setting of the resonance frequency more accurate.

2. A method according to claim 1, characterized in that in order to produce said difference signal the input signal voltage and resonator voltage are multiplied by one another, the signal produced by the multiplication mentioned above is amplified, and the frequency components the frequencies of which at least equal the frequency of said input signal are attenuated in the resulting signal.

3. A method according to claim 1, characterized in that in order to produce said difference signal the input signal voltage and resonator voltage are mixed with one another, and the frequency components the frequencies of which at least equal the frequency of said input signal are attenuated in the resulting signal.

4. A method according to claim 1, characterized in that in order to change the resonance frequency of the resonator the capacitance of the resonator is controlled as a function of said difference signal.

5. A arrangement for reducing noise on a receive band of a radio device, an input signal of which feeds a resonator so that the resonator oscillates at the frequency of the input signal, and in the apparatus the center frequency of the pass band of the resonator is set substantially to the frequency of the input signal, said apparatus comprising:

means for generating a difference signal proportional to the phase difference between the input signal voltage and resonator voltage, means for changing the resonance frequency of the resonator on the basis of the difference signal in such a manner that said phase difference becomes smallery means for arranging said resonator to pass the input signal having modulation, and means for amplifying said difference signal to make the setting of the resonance frequency more accurate.

6. An arrangement according to claim 5, characterized in that in order to produce a difference signal proportional to the phase difference between the input signal voltage and resonator voltage it comprises means (210) for multiplying the input signal voltage and resonator voltage by one another, means (251) for amplifying the signal produced by the multiplication mentioned above, and means (220) for attenuating in the resulting signal the frequency components the frequencies of which at least equal the frequency of said input signal.

7. An arrangement according to claim 6, characterized in that the means for multiplying the input signal voltage and resonator voltage by one another comprises a Gilbert cell (211) a first input of which is connected to the input of the filter comprising said resonator and a second input of which is connected to the output of said filter.

8. An arrangement according to claim 5, characterized in that it comprises at least one capacitance diode (CD1) controlled by said difference signal in order to change the resonance frequency of the resonator.

9. An arrangement according to claim 5, characterized in that in order to produce a difference signal proportional to the phase difference between the input signal voltage and resonator voltage it comprises means for mixing the input signal voltage and resonator voltage with one another, and means (240) for amplifying the resulting signal and for attenuating frequency components the frequencies of which at least equal the frequency of said input signal.

10. An arrangement according to claim 9, characterized in that the means for mixing the input signal voltage and resonator voltage with one another comprises a balanced diode mixer (215) a first input of which is connected to the input of the filter comprising said resonator and a second input of which is connected to the output of said filter.

* * * * *